United States Patent
Gattuso

(10) Patent No.: US 7,736,166 B2
(45) Date of Patent: Jun. 15, 2010

(54) SOCKET WITH PUSH FINGER

(75) Inventor: Andrew Gattuso, Chandler, AZ (US)

(73) Assignee: Hon Hai Precision Ind. Co., Ltd., Taipei, Hsien (TW)

( * ) Notice: Subject to any disclaimer, the term of this patent is extended or adjusted under 35 U.S.C. 154(b) by 131 days.

(21) Appl. No.: 11/897,820

(22) Filed: Aug. 31, 2007

(65) Prior Publication Data

US 2009/0059544 A1    Mar. 5, 2009

(51) Int. Cl.
    *H01R 13/62*    (2006.01)
(52) U.S. Cl. ....................................... 439/331
(58) Field of Classification Search ............. 439/331, 439/330, 73, 70, 74, 71; 361/704, 719
    See application file for complete search history.

(56) References Cited

U.S. PATENT DOCUMENTS 5,989,039 A    11/1999    Sik 6,739,894 B2 *    5/2004    Ogura ................. 439/330
6,811,421 B1 *    11/2004    Gattuso et al. ......... 439/266
7,247,042 B2 *    7/2007    Matsuo et al. .......... 439/330

FOREIGN PATENT DOCUMENTS

JP    2003-123926    4/2003
JP    2004-63107     2/2004

* cited by examiner

*Primary Examiner*—Javaid Nasri
(74) *Attorney, Agent, or Firm*—Andrew C. Cheng; Wei Te Chung; Ming Chieh Chang

(57) ABSTRACT

A socket, for holding a semiconductor package, comprises a housing receiving a plurality of contacts and defining a space, a plurality of actuators assembled to the housing around the space, a lid movably assembled to the housing, a plurality of push fingers and a plurality of springs urging the push fingers. When the lid moves downwardly, the actuators are actuated to open the space and let the semiconductor package locate in the space, synchronously, the push fingers are forced by the lid to slide away from the space; When the lid moves upwardly, the actuator rotates to close the space and press the semiconductor package, and then the push fingers move back toward the space to position the semiconductor package by restore forces of the springs.

9 Claims, 11 Drawing Sheets

SOCKET WITH PUSH FINGER

BACKGROUND OF THE INVENTION

1. Field of the Invention

The present invention relates to the art of electrical connector, and more specially to a socket for electrically interconnecting two electrical interfaces, such as a semiconductor package and a circuit board.

2. Description of the Prior Art

A conventional connector comprises a housing defining a receiving space and receiving a plurality of terminals, a plurality of actuators assembled to the housing around the receiving space, and a cover movably assembled to the housing in a top-to-bottom direction. The actuator defines a close position and an open position to open/close the receiving space. When the cover moves downwardly, the actuators are brought to move from the close position to the open position, a semiconductor package is put in the receiving space from a top side, then the cover is released and moves upwardly to an initial position, the actuator returns to the close position and downwardly presses the semiconductor package to make the semiconductor package electrically contact with the terminals. However, the semiconductor package is not adjusted and positioned after being located in the receiving space, so the semiconductor package may not be accurately positioned with the terminals on the housing, which will influence the whole performance of the socket.

Accordingly, a new socket that solves the above problems is desirable.

SUMMARY OF THE INVENTION

Accordingly, an object of the present invention is to provide a socket, which can position the semiconductor package received therein.

To fulfill the above object, a socket for a semiconductor package comprises a housing receiving a plurality of terminals and defining a space in a center thereof for receiving the semiconductor package; at least one push finger mounted to the housing and protruding into the space, the push finger being able to outwardly slide to leave the space; and a lid movably assembled to the housing.

Other objects, advantages and novel features of the present invention will become more apparent from the following detailed description when taken in conjunction with the accompanying drawings, in which:

DESCRIPTION OF PREFERRED EMBODIMENTS OF THE INVENTION

Figure 1:
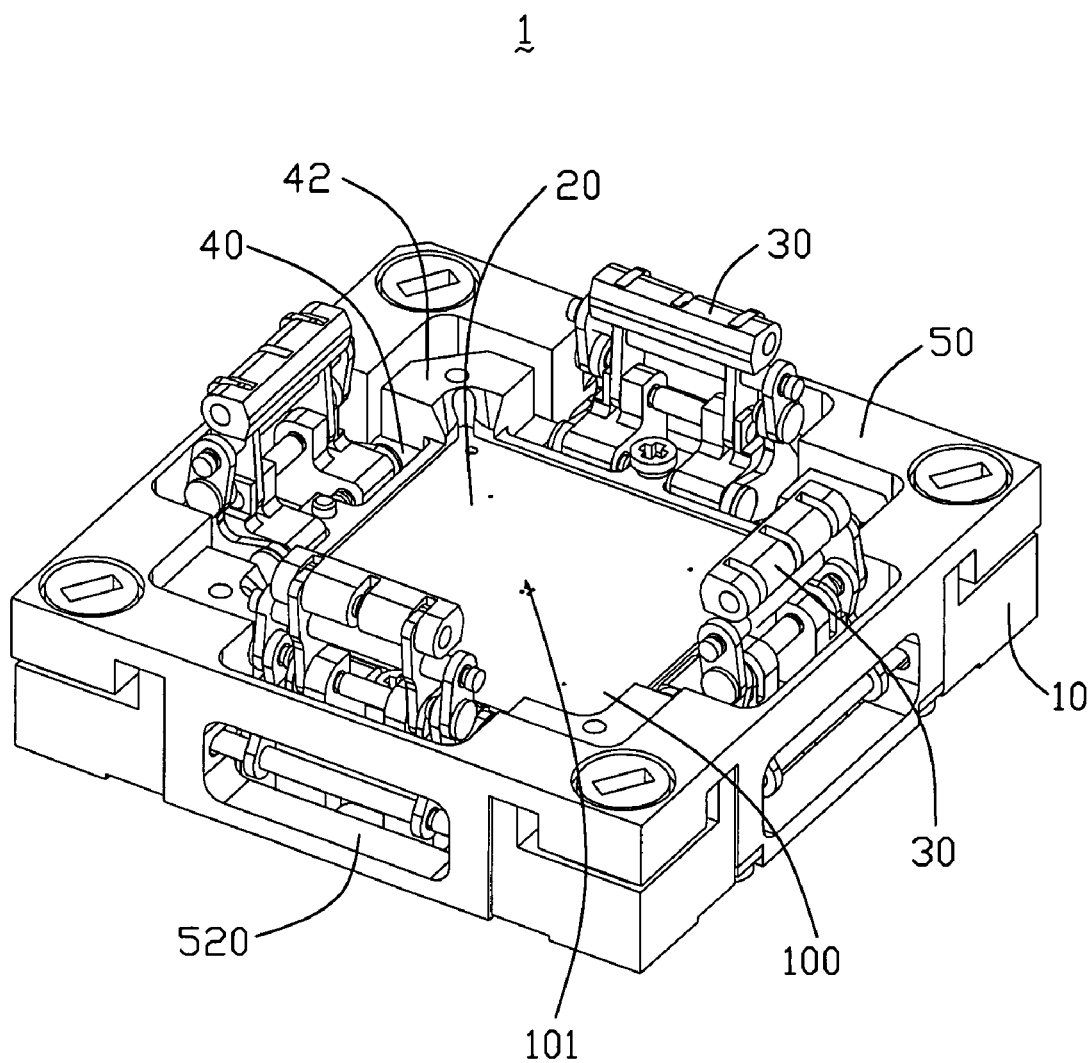
FIG. 1 is an assembled, perspective view of a socket according to the present invention, wherein a plurality of actuators are in an open state.

Reference is now made to the drawings to describe the invention in detail.

Referring to FIGS. 1-4, the socket 1 receives a plurality of terminals 101 (here only showing one) for contacting with a semiconductor package (not shown). The socket 1 comprises a rectangular base 10, a bottom plate 20 assembled to the base 10, four actuators 30 respectively mounted to four sides of the base 10, a rectangular frame member 40 mounted on the base 10, a lid 50 movably assembled to the base 10 and a plurality of push fingers 60 (referring to FIG. 4).

Figure 3:
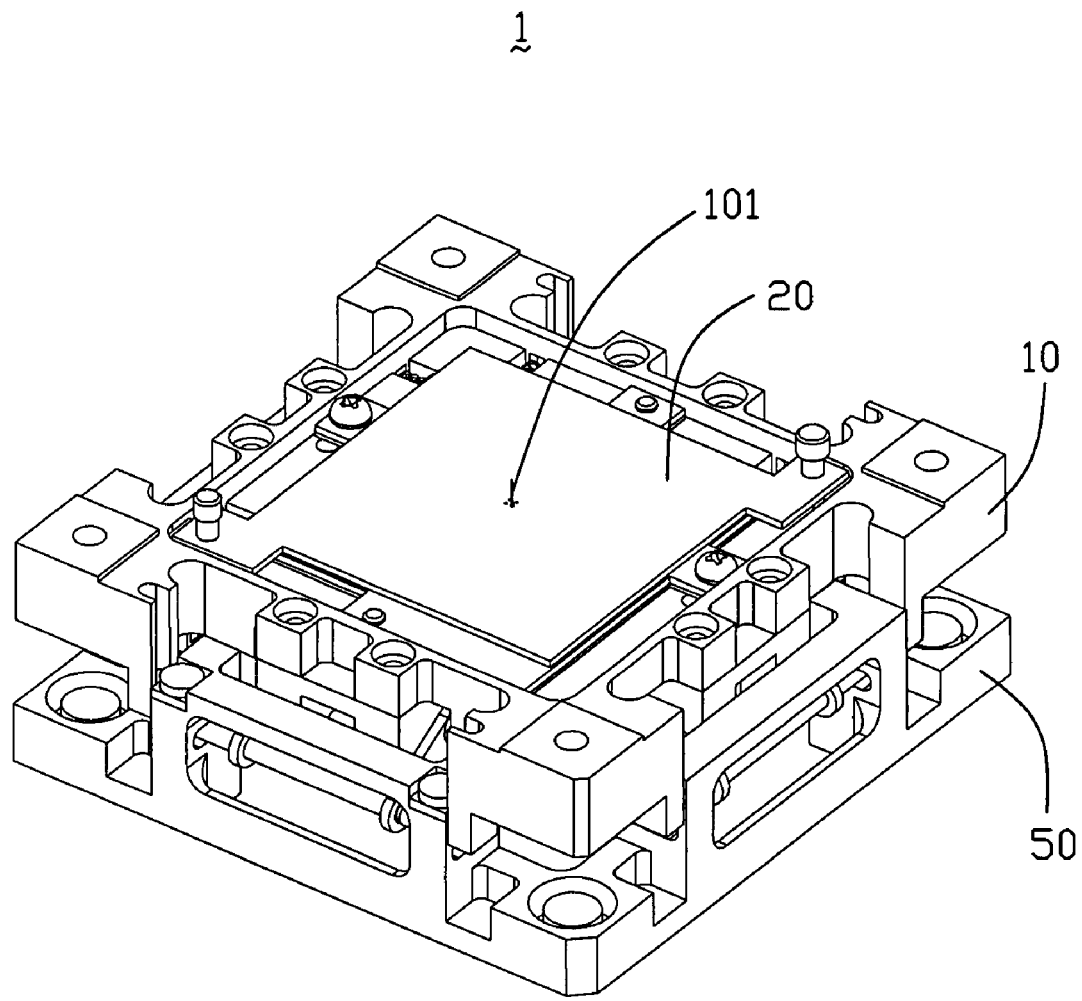
FIG. 3 is a bottom view of the socket shown in FIG. 2.
Figure 4:
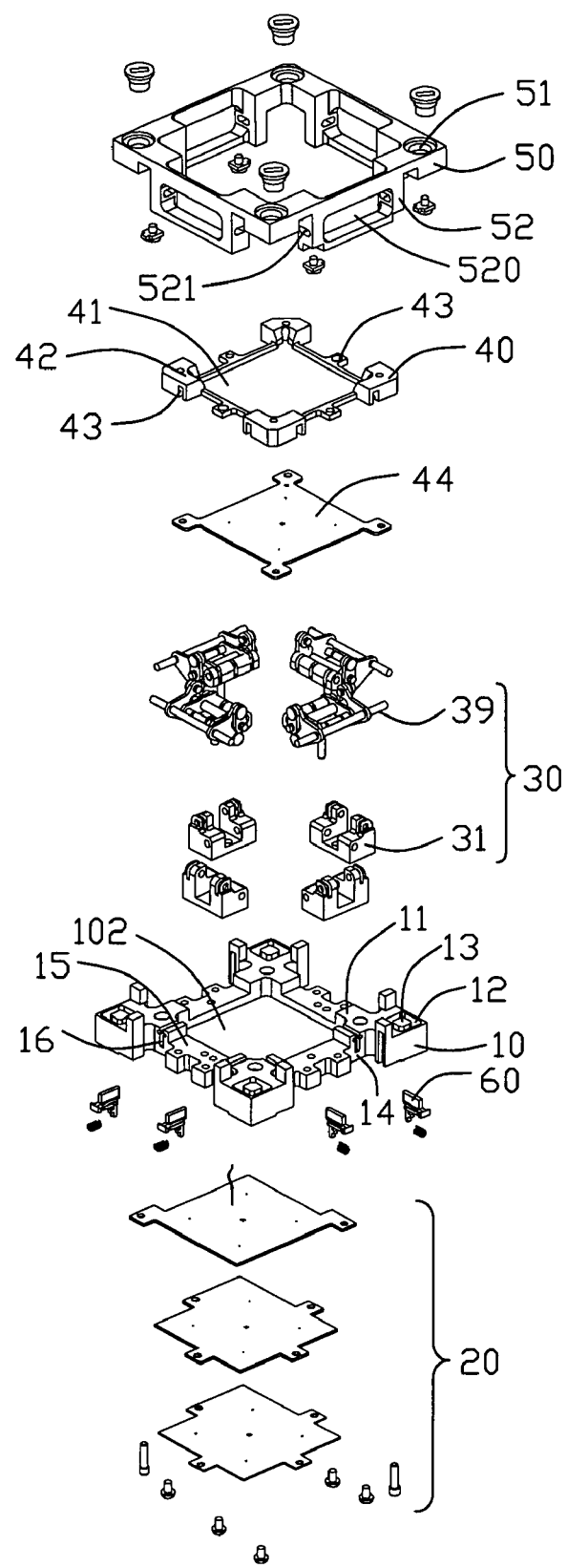
FIG. 4 is a partially exploded, perspective view of the socket shown in FIG. 2.

Continuing referring to FIG. 4, and conjoining with FIG. 3, the bottom plate 20 is formed by three pieces of planes, which are approximate in rectangular shapes, and has a plurality of mounting portions to attach the bottom plate 20 to the base 10 by blots (not labeled). The base 10 has a center hole 102 and is formed with four rims 11, each connecting with adjacent two rims 11 to form a rectangular shape with four corners. Each corner is provided with a recess 12 recessed from a top surface of the base 10 and a pin 13 protruding from a center part of the recess 12. Each rim 11 is provided with an outward gap 14 in a center part thereof.

The frame member 40 defines an opening 41 with same size with the center hole 102 of the base 10 and is provided with four outwardly and upwardly protruding corners 42 to be located in two adjacent actuators 30 assembled on the base 10 and four mounting portions 43 for engaging with the base 10. The frame member 40 has another plane 44 attached to a bottom surface thereof. The frame member 40 is mounted to the base 10 from a top side and defines a space 100 together with the base 10 for locating the semiconductor package (not shown). The base 10, the bottom plate 20 and the frame member 40 are assembled together to form a housing.

Figure 2:
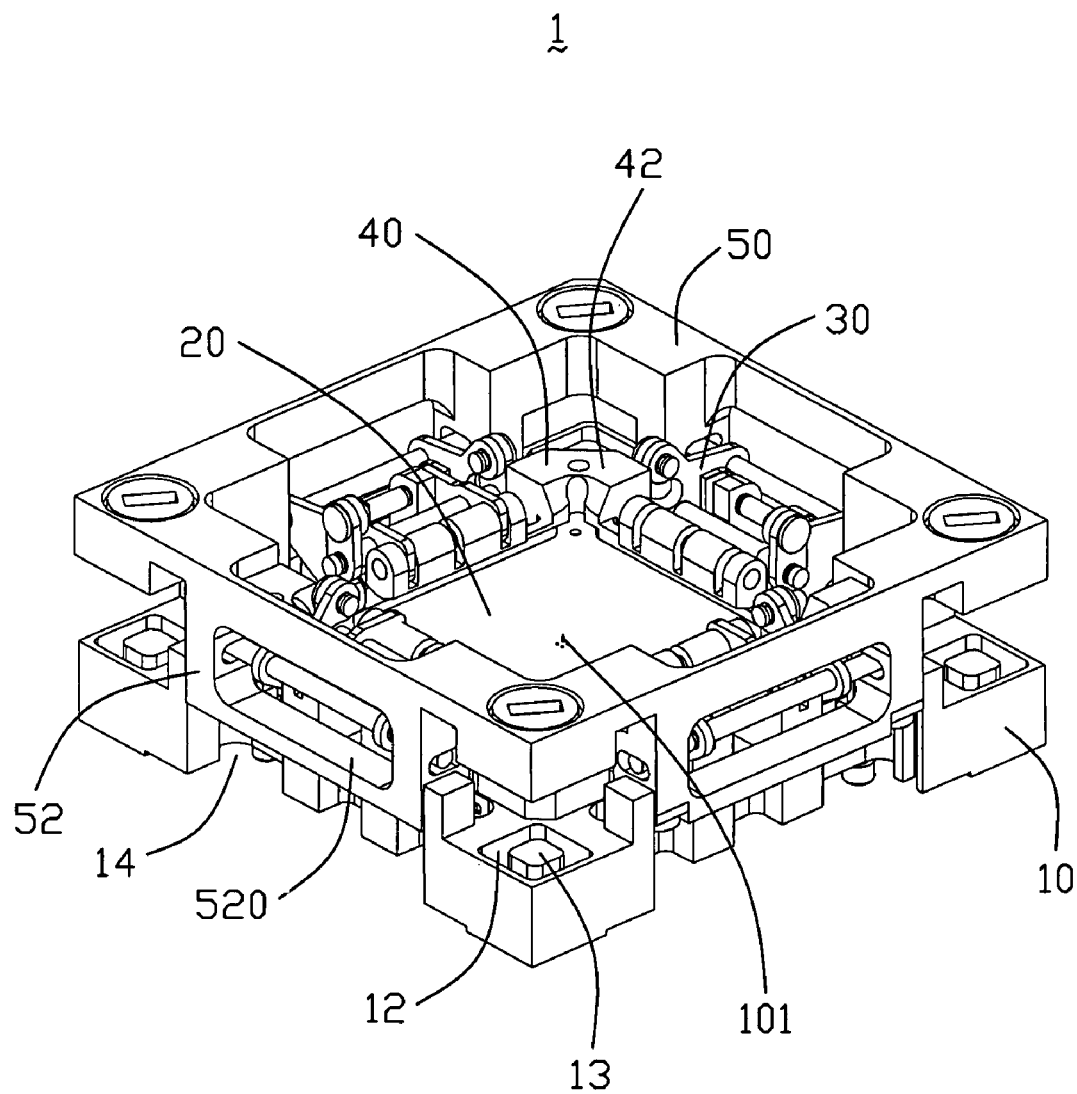
FIG. 2 is another assembled, perspective view of the socket according to present invention, wherein the actuators are in a close state.

Continuing referring to FIG. 4, and conjoining with FIGS. 1-2, the lid 50 has a rectangular configure with substantially same size with the base 10. The lid 50 is formed with four engaging holes 51 on four corners thereof corresponding to the recesses 12 of the base 10 and four downwardly extending sidewalls 52 aligned with corresponding gaps 14 of the base 10 and each defining a through slot 520. The lid 50 is movably assembled to the base 10 in a top-to-bottom direction with a plurality springs (not shown) located between them. The springs surround the pins 13 in the recesses 12 of the base 10 and screws (not labeled) inserted into the engaging holes 51 of the lid 50, the sidewalls 52 are able to insert into the gaps 14 of the base 10.

Figure 5:
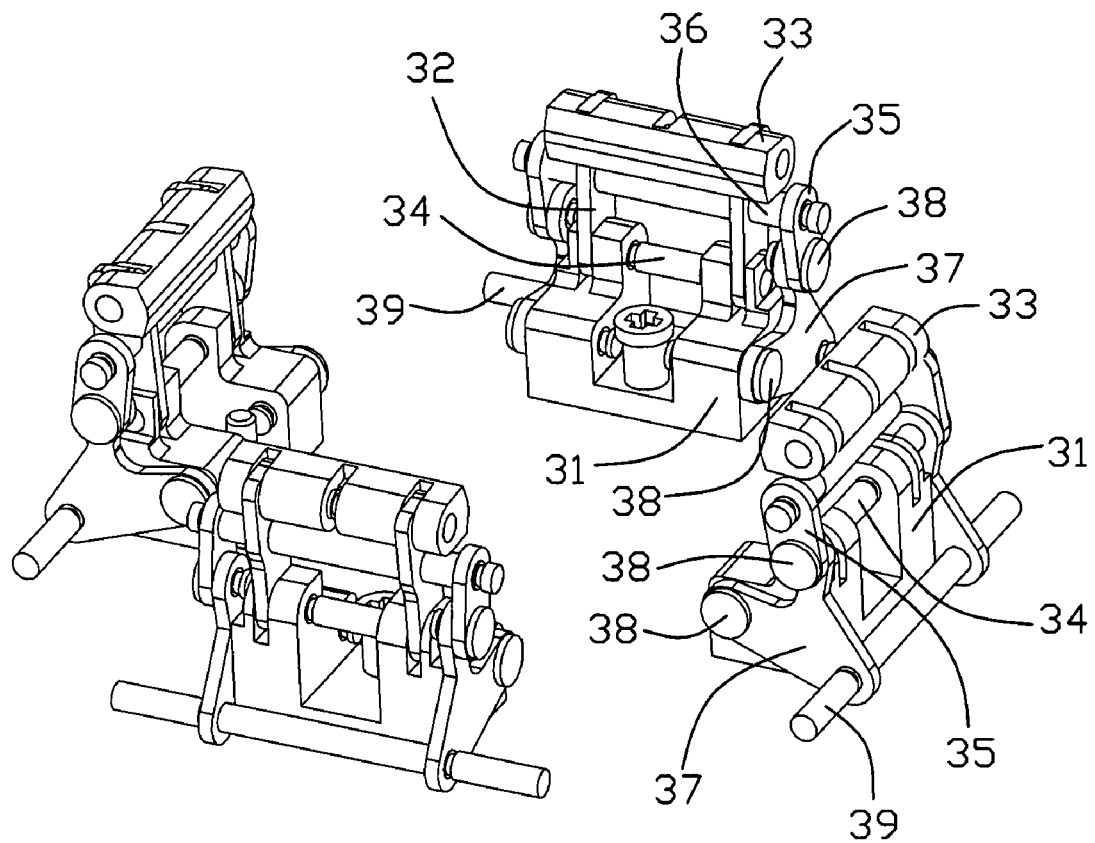
FIG. 5 is a perspective view of the actuators in the open state.
Figure 6:
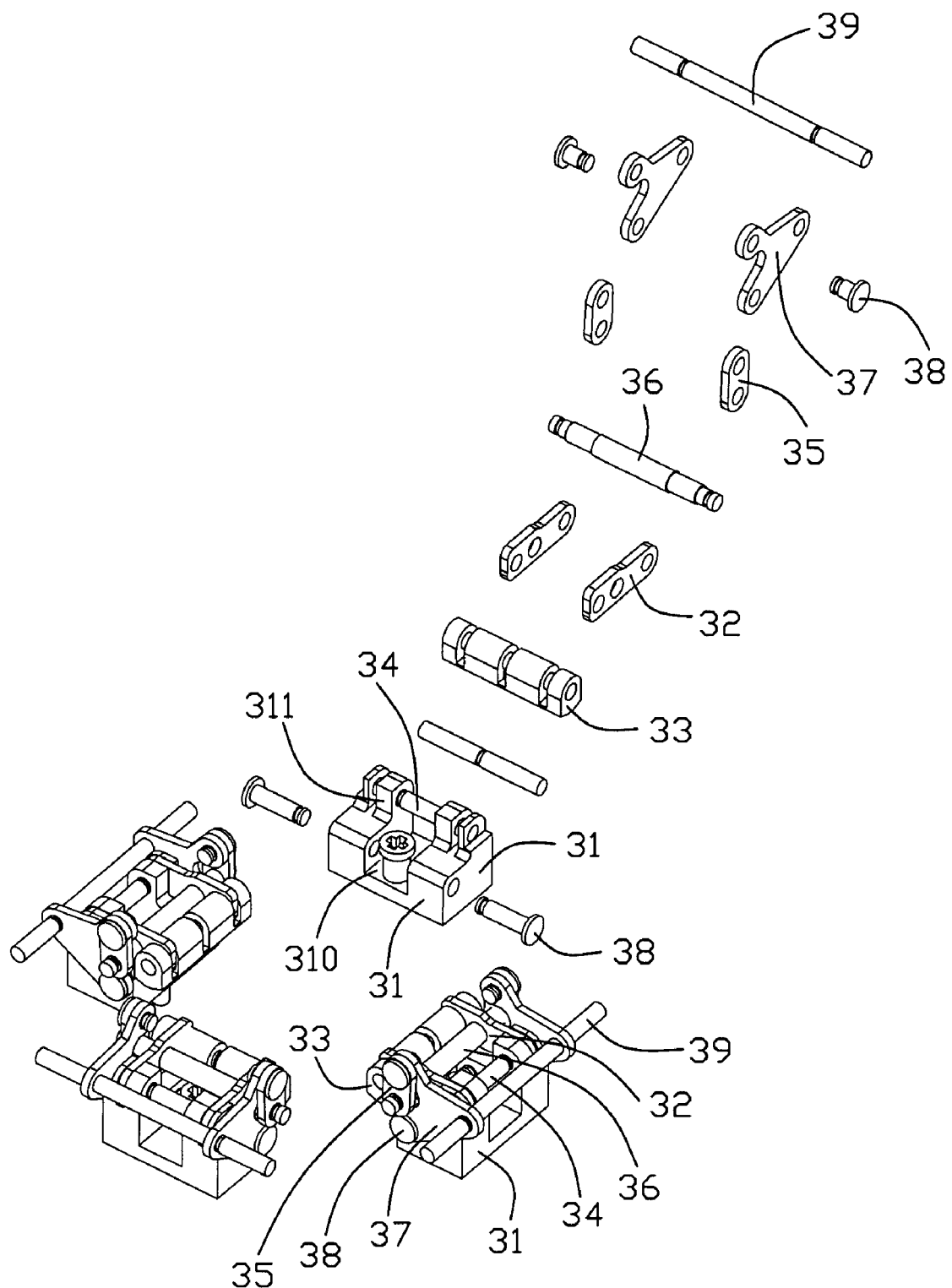
FIG. 6 is a perspective view of the actuators in the close state, wherein one actuator is partially exploded to show details.

Referring to FIGS. 5-6, the actuators 30 are mounted to the rims 11 of the base 10 to engage with the semiconductor package (not shown). Each actuator 30 comprises a bracket 31, a pair of bar-like first linking portions 32, whose ends are linked by a pressing portion 33 by a pole (not labeled), pivotally assembled to the bracket 31 by a first pivot 34, a pair of bar-like second linking portions 35 pivotally attached the first linking portions 32 by a second pivot 36, a pair of approximate triangular third linking portions 37 each linked with the second linking portions 35 by a pair of pegs 38, and a third pivot 39 inserting into a pair of holes (not labeled) respectively defined on an out corner of the third linking portion 37. And the third linking portions 37 are retained to the bracket 31 by two another pegs 38. The bracket 31 has a platform 310 and a pair of supporting arms 311 upwardly extending from two lateral sides of the platform 310.

Figure 7:
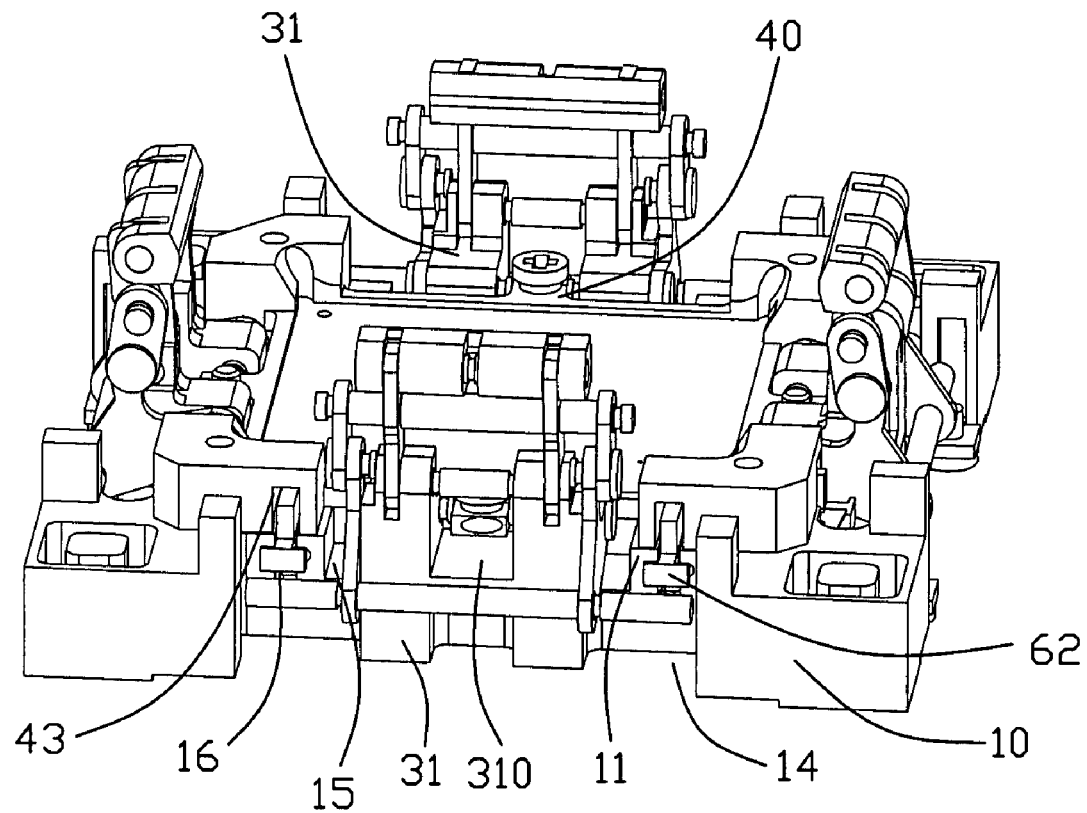
FIG. 7 is similar with FIG. 1, except that a lid is detached from the socket.

Conjoined with FIGS. 2, 4 and 7, the lid 50 further defines a plurality of holes 521 respectively on opposed lateral inner sides of each through slot 520. The third pivot 39 passes the holes 521 of the lid 50 to assemble the actuator 30 to the lid 50. And then, a blot (not labeled) retains the platform 310 of the bracket 31 to a center part 15 of the rim 10 of the base 10 through the frame member 40, by this way, the actuator 30 is assembled to the socket 1. Wherein the center part 15 is downwardly recessed from a top surface of the rim 11 of the base 10.

Hereinafter, we will describe how the actuator 30 works. Primitively, the lid 50 is at a highest position, the actuator 30 is in a close state, as shown in FIGS. 2 and 6, when the third pivot 39 is brought by the lid 50 to downwardly moves, the third linking portion 37 rotates around the peg 38 retained to the bracket 31 and takes the second linking portion 35 to upwardly move, and then, the second pivot 36, together with the first linking portion 32 and the pressing portion 33, begins to upwardly rotate around the first pivot 34 to complete open the space 100, as shown in FIGS. 1 and 5. After the semiconductor package (not shown) is put in the space 100, the lid 50 upwardly moves and upwardly brings the third pivot 39, the third linking portion 37 rotates downwardly toward the space 100 and around the peg 38 retained to the bracket 31 and takes the second linking portion 35 to move downwardly, and then, the second pivot 36 begins to downwardly rotate around the first pivot 34 to put down the pressing portion 33 to press the semiconductor package (not shown) received in the space 100, so that semiconductor package (not shown) can reliably electrically contact with the terminals 101.

Figure 8:
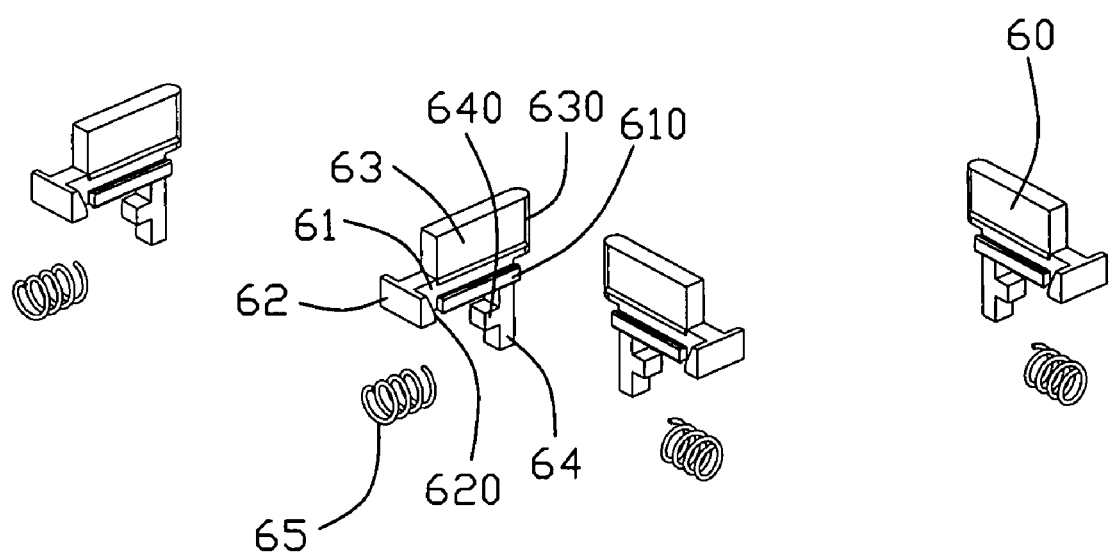
FIG. 8 is a perspective view of a plurality of push fingers of the socket.
Figure 10:
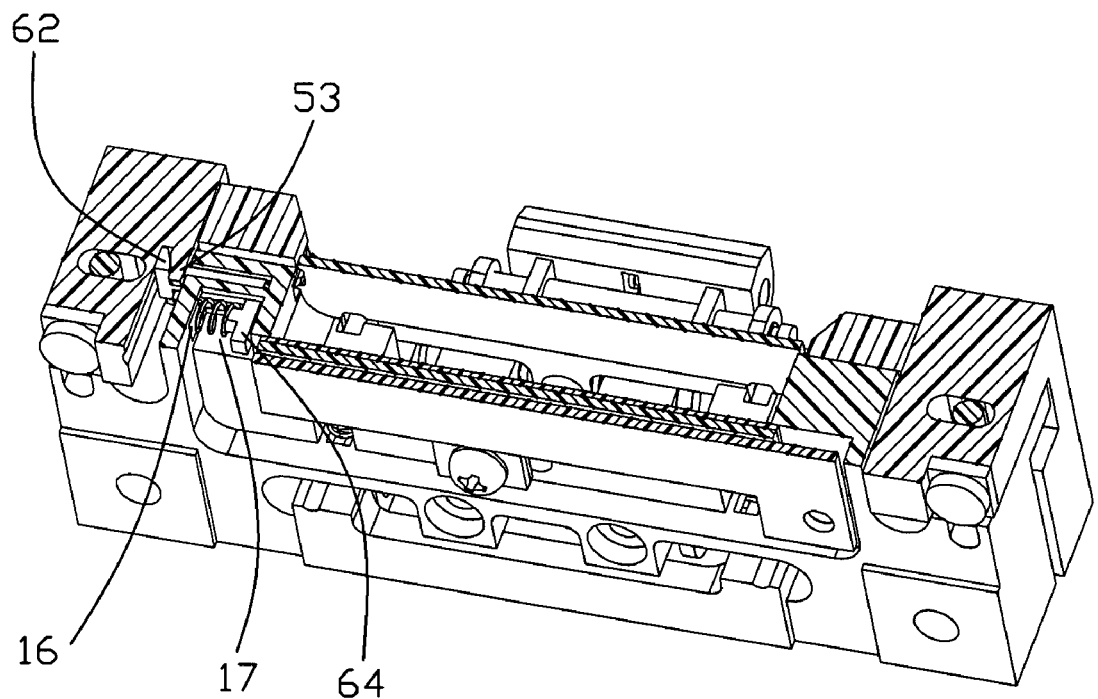
FIG. 10 is a section view of the socket connector, showing the push finger in the socket when the lid arrives a lowest position.
Figure 11:
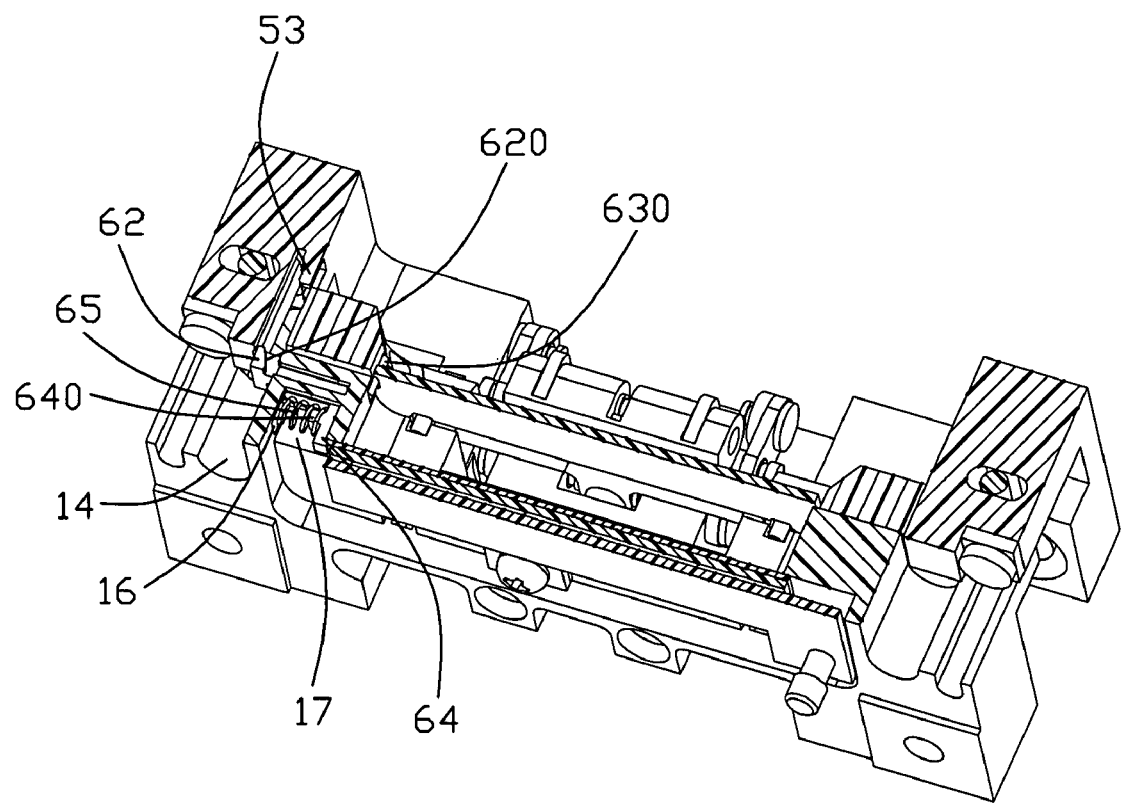
FIG. 11 is similar with FIG. 10, showing the push finger in the socket when the lid is at a highest position.

Referring to FIGS. 7-8, conjoined with FIGS. 10 and 11, the push fingers 60 are sandwiched between the base 10 and the frame member 40. The push finger 60 has a main body 61 with a pair of wings 610, an enlarged head 61 laterally extending from an out end of the main body 61, a vertical wall 63 extending upwardly from the main body 61 with a protruding edge 630, and a foot 64 extending downwardly from the main body 61 with a protruding pin 640. The head 62 has an incline surface 620 faced the vertical wall 63.

Conjoined with FIGS. 4, 7, 10 and 11, the base 10 defines a plurality of vertical grooves 16 on the rim 11 near corresponding center parts 15 and a plurality of rooms 17 recessed from the bottom surface thereof and communicating with corresponding grooves 16. Each groove 16 defines a pair of lateral channel (not labeled) for guiding the wings 63 of the push finger 60, a part of the groove 16 outside the room 17 further downwardly extends for the foot 64 of the push finger 60 passing and inserting into the room 17. The frame member 40 correspondingly defines a plurality of slots 43 recessed from a bottom surface thereof and aligned with corresponding grooves 16 of the base 10, when the frame member 40 assembles to the base 10.

The push finger 60 is inwardly inserted into corresponding grooves 16 of the base 10 and corresponding slot 42 of the frame member 40 until the foot 64 touches an inner side of the rooms 17, and then, a spring 65 is put in the room 17 and surrounds the protruding pin 640 to inwardly urge the push finger 60 toward the space 100. At this situation, the protruding edge 630 of the vertical wall 63 protrudes into the space 100 (referring to FIG. 11), and the head 62 is located in the gap 14.

Figure 9:
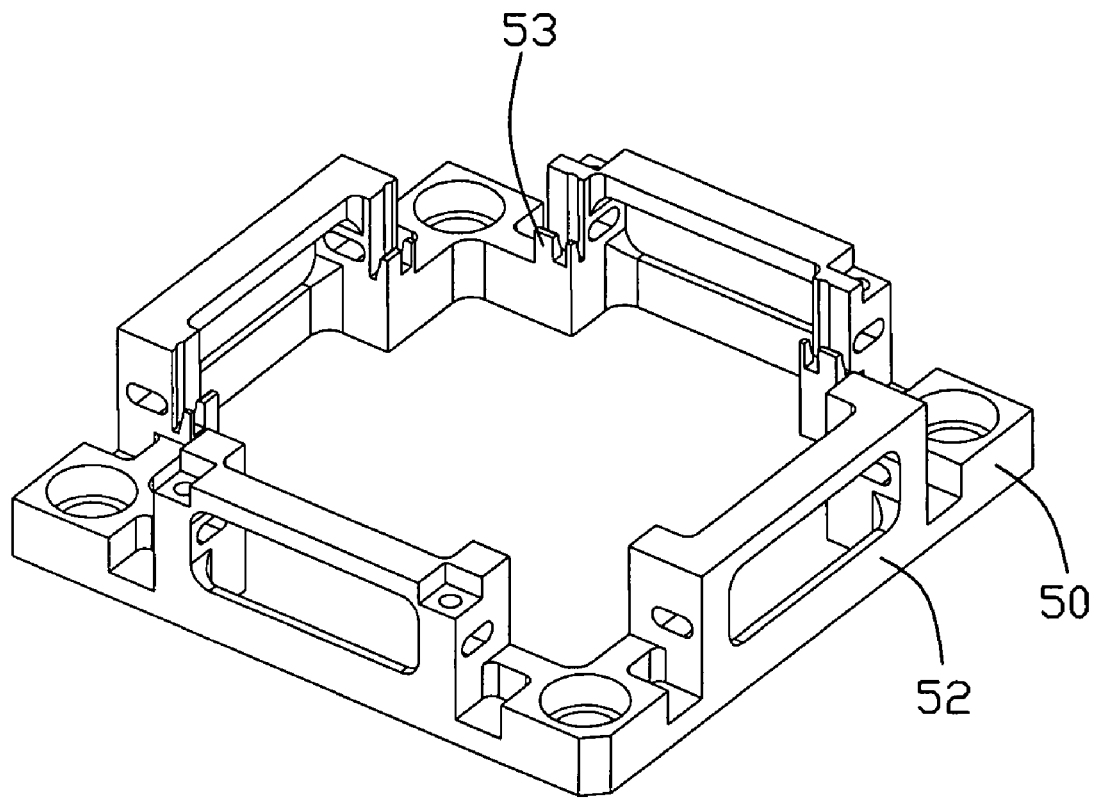
FIG. 9 is a bottom view of a base of the socket.

Referring to FIGS. 9-11, the lid 50 is formed with a plurality of protruding engaging portions 53. When the lid 50 moves downwardly, the protruding engaging portions 53 downwardly move and abut against the incline surfaces 620 of the push fingers 60 to outwardly force the push fingers 60 and make the protruding edges 630 leave the space 100, so that the semiconductor package (not shown) can be smoothly put in the space 100. When the lid 50 moves upwardly, the springs 65 urge the push fingers 60 toward the space 100 to make the protruding edges 630 crush the semiconductor package (not shown) to adjust and position the semiconductor package (not shown) received in the space 100. So that the socket 1 can obtains a well performance.

Furthermore, although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A socket for a semiconductor package comprising:
   a housing receiving a plurality of terminals and defining a space in a center thereof for receiving the semiconductor package;
   at least one push finger mounted to the housing and protruding into the space to crush the semiconductor package, the push finger being able to outwardly slide to leave the space, so that the semiconductor package can be smoothly put in the space;
   a lid movably assembled to the housing;
   a plurality of actuators rotatablely assembled to the housing, each actuator has a part actuated by the lid to bring the actuator to open/close the space; and
   at least one spring which urges the push finger into the space, the at least one spring has two ends, which abut against the housing and the push finger, respectively.

2. The socket of claim 1, wherein the push finger has an incline surface, the lid has at least one engaging portion which forces the incline surface of the push finger to move away from the space, when the lid downwardly moves relative to the housing.

3. The socket of claim 2, wherein the housing defines at least one slot in which the push finger is received and slides, the push finger has a header which is located out of the slot and is actuated by the engaging portion of the lid.

4. The socket of claim 3, further comprising at least one spring, the spring is located in a room defined by the housing under the slot and urges the push finger toward the space, the spring is compressed when the push finger moves away from the space.

5. The socket of claim 4, wherein the push finger has a main body, a vertical wall upwardly extending from the main body with a protruding edge protruding into the space to abut against the semiconductor package, a header disposed at an end of the main body to be outwardly forced by the lid, and a foot downwardly extending from the main body which is inwardly urged toward the space by a spring.

6. A socket comprising:
   a housing receiving a plurality of terminals and defining a space;
   a lid assembled to the housing and being movable in a top-to-bottom direction;
   a plurality of actuators, which are mounted to the housing around the space and actuated by the lid to open/close the space;

at least one push finger mounted to the housing, the push finger having a protruding portion protruding into the space and being able to slide on the housing; and at least one spring, the spring abuts against the housing and the push finger to urge the push finger toward the space; wherein when the lid downwardly moves, the push finger is forced to horizontally slide away from the space against the spring; and when the lid upwardly moves, the push finger horizontally slides to original position and protrudes into the space by a restore force of the spring; wherein the push finger has a header with an incline surface, the lid has at least one blocking portion which abuts against the incline surface and forces the push finger to move away from the space.

7. A socket comprising:

a housing receiving a plurality of terminals and defining a space for receiving an electronic package therein;

a lid assembled to the housing and being movable up and down in a vertical direction;

a plurality of actuators, which are mounted to the housing around the space and actuated by the lid to open/close the space; wherein said actuator including a first linking member, pivotable about a first pivot, a second linking member having one section pivotally connected to a middle portion of the first linking member, and another section pivotally connected to a third linking member which is pivotable about a second pivot, under a condition that a pressing portion for pressing said electronic package is positioned on the first linking member, and the third linking member is actuated by the lid.

8. The socket of claim 7, wherein a push finger is assembled to the housing and moveable in a transverse direction under a condition that the push finger is actuated by said lid.

9. The socket of claim 8, wherein the push finger is further actuated by a spring so as to urge the push finger toward the electronic package when the lid is in a closed position.

* * * * *